US005545440A

United States Patent [19]
Thornberg

[11] Patent Number: 5,545,440
[45] Date of Patent: Aug. 13, 1996

[54] METHOD AND APPARATUS FOR POLYMER COATING OF SUBSTRATES

[75] Inventor: Gary R. Thornberg, Colorado Springs, Colo.

[73] Assignees: AT&T Global Information Solutions Company (aka NCR Corporation), Dayton, Ohio; Hyundai Electronics America, Milpitas, Calif.; Symbios Logic Inc., Fort Collins, Colo.

[21] Appl. No.: 349,640

[22] Filed: Dec. 5, 1994

[51] Int. Cl.$^6$ .................... B05D 1/40; B05D 3/12
[52] U.S. Cl. ............. 427/345; 427/385.5; 427/430.1
[58] Field of Search .................... 427/601, 434.3, 427/434.5, 385.5, 600, 345, 430.1

[56]     References Cited

U.S. PATENT DOCUMENTS

| | | | |
|---|---|---|---|
| 3,369,918 | 2/1968 | Young | 427/345 |
| 3,526,536 | 9/1970 | Spengos et al. | 427/434.3 |
| 3,554,878 | 7/1971 | Rothschild | 205/125 |
| 3,705,457 | 12/1972 | Tardokegyi | 427/345 |
| 3,751,288 | 8/1973 | Alfrey, Jr. et al. | 427/434.3 |
| 3,836,388 | 9/1974 | Fowler | 117/120 |
| 3,850,765 | 11/1974 | Karustis, Jr. et al. | 205/253 |
| 3,875,029 | 4/1975 | Rosenberg et al. | 205/253 |
| 3,905,878 | 9/1975 | Dohi et al. | 205/254 |
| 4,000,047 | 12/1976 | Ostrow et al. | 205/253 |
| 4,003,877 | 1/1977 | Lipson et al. | 260/47 UA |
| 4,004,045 | 1/1977 | Stelter | 427/420 |
| 4,153,523 | 5/1979 | Koontz et al. | 205/668 |
| 4,169,732 | 10/1979 | Shipley | 96/35.1 |
| 4,186,062 | 1/1980 | Eidschun | 205/125 |
| 4,217,182 | 8/1980 | Cross | 174/250 |
| 4,220,506 | 9/1980 | Skurkiss et al. | 205/129 |
| 4,246,865 | 1/1981 | Shimada et al. | 427/601 |
| 4,263,106 | 4/1981 | Kohl | 205/293 |
| 4,269,870 | 5/1981 | Boynton | 427/96 |
| 4,289,846 | 9/1981 | Parks et al. | 430/314 |
| 4,293,637 | 10/1981 | Hatada et al. | 437/183 |
| 4,304,640 | 12/1981 | Walker | 361/748 |
| 4,353,934 | 10/1982 | Nakashima et al. | 427/601 |
| 4,358,349 | 11/1982 | Masami et al. | 205/126 |
| 4,360,144 | 11/1982 | Cuddy et al. | 228/180 R |
| 4,370,356 | 1/1983 | Bok et al. | 427/294 |
| 4,487,654 | 12/1984 | Coppin | 216/18 |
| 4,487,828 | 12/1984 | Hladovcak et al. | 430/313 |
| 4,508,758 | 4/1985 | Wong | 427/96 |
| 4,526,859 | 7/1985 | Christensen et al. | 430/314 |
| 4,528,259 | 7/1985 | Sullivan | 430/312 |
| 4,551,488 | 11/1985 | Leech et al. | 523/427 |

(List continued on next page.)

OTHER PUBLICATIONS

"Passivation Process for Semiconductor Device with Fusible Link Redundancy"; IBM Technical Disclosure Bulletin; vol. 23, No. 10, Mar. 1981; D. E. Davis, W. T. Motsiff and N. R. Poulin; pp. 4451–4452.

"Method of Connecting Layers of Circuitry Separated by a Dielectric"; IBM Technical Disclosure Bulletin; vol. 22, No. 10, Mar. 1980; O. R. Abolafia; pp. 4471–4473.

*Primary Examiner*—Diana Dudash
*Attorney, Agent, or Firm*—Wayne P. Bailey; Duke W. Yee

[57]     ABSTRACT

A process for coating a surface of a substrate with a polymer material. The process includes heating a polymer to a preselected temperature such that the polymer, if solid, is in a liquid state or if liquid in a less viscous state to form a polymer solution. The polymer solution may contain other components such as a carrier in addition to the polymer. The polymer solution is heated to a preselected temperature below the flashpoint temperature of the polymer solution. The polymer solution is held in reservoir and propelled through a nozzle to create a continuous flow of polymer solution in the form of a stationary wave. The polymer solution flowing out of the nozzle returns to the reservoir, wherein it again will be sent through the nozzle. A substrate having a lower surface is moved over the stationary wave at a preselected rate such that the lower surface of the substrate contacts the stationary wave. A uniform film of polymer is coated on the lower surface of the substrate after the substrate has been moved over and passed the stationary wave.

14 Claims, 1 Drawing Sheet

U.S. PATENT DOCUMENTS

| | | | |
|---|---|---|---|
| 4,560,445 | 12/1985 | Hoover et al. | 205/126 |
| 4,566,624 | 1/1986 | Comerford | 228/180.1 |
| 4,569,743 | 2/1986 | Bayer et al. | 204/192.25 |
| 4,586,990 | 5/1986 | Drazin et al. | 205/253 |
| 4,589,962 | 5/1986 | Sajja et al. | 205/50 |
| 4,608,941 | 9/1986 | Morris | 118/63 |
| 4,640,739 | 2/1987 | Modic et al. | 216/48 |
| 4,695,482 | 9/1987 | Weiswurm | 427/96 |
| 4,696,832 | 9/1987 | Wright | 427/58 |
| 4,775,573 | 10/1988 | Turek | 428/209 |
| 4,790,912 | 12/1988 | Holtzman et al. | 427/97 |
| 4,830,263 | 5/1989 | Dexheimer | 228/180.1 |
| 4,854,040 | 8/1989 | Turek | 29/847 |
| 4,863,808 | 9/1989 | Sallo | 428/601 |
| 4,925,525 | 5/1990 | Oku et al. | 216/13 |
| 4,928,387 | 5/1990 | Mather et al. | 29/840 |
| 4,937,309 | 6/1990 | Chao et al. | 528/125 |
| 4,938,994 | 7/1990 | Choinski | 427/96 |
| 5,014,737 | 5/1991 | Berman | 137/334 |
| 5,028,513 | 7/1991 | Murakami et al. | 430/315 |
| 5,194,137 | 3/1993 | Moore | 205/125 |
| 5,270,079 | 12/1993 | Bok | 427/434.3 |
| 5,316,788 | 5/1994 | Dibble | 427/98 |

METHOD AND APPARATUS FOR POLYMER COATING OF SUBSTRATES

BACKGROUND OF THE INVENTION

1. Technical Field

The present invention relates to a method for processing a substrate and in particular to a method for coating a polymer onto a substrate. Still more particularly, the present invention is related to a method for coating a polymer onto a square or irregular shaped substrate.

2. Description of the Related Art

It is often desirable to place a polymer coating, such as photoresist film, on a substrate to protect underlying film types, such as $SiO_2$, aluminum, copper polysilicon, or silicon nitride. The polymer should be of a sufficient thickness on the substrate to provide an effective barrier to various etches, ion implantation, or mechanically induced damage. In placing coatings on a substrate, it is typically desirable to provide a very uniform film over the substrate.

One method in which thin uniform films of polymers are formed over a substrate involves introducing drops of liquid polymer onto a substrate, such as a circular wafer that is held by a vacuum chuck which can be set to rotate accurately at some predetermined speed. The wafer is then spun and centrifugal forces spread the liquid outwards with any excess being thrown clear of the periphery of the wafer. In a spin coating application, 90 to 95 percent of the polymer material is spun off and wasted.

Additionally, such a process is not very efficient when wafers, such as square wafers or other non-circular wafers, are coated with a polymer. In these cases, spin coating of polymers on the substrate may result in problems with uniformity at the corners of the substrate. Therefore, it would be advantageous to have an improved process for coating a polymer on a substrate that provides for uniformity and thickness over the entire surface and saves a considerable quantity of polymer.

SUMMARY OF THE INVENTION

It is one object of the present invention to provide a method for processing a substrate.

It is another object of the present invention to provide a method for coating a polymer on a substrate.

It is yet another object of the present invention to provide a method for coating a polymer onto a square or irregular shaped substrate.

The present invention provides a process for coating a surface of a substrate with a polymer material. The process includes heating a polymer to a preselected temperature such that the polymer, if solid, is in a liquid state or if liquid in a less viscous state to form a polymer solution. The polymer solution may contain other components such as a carrier in addition to the polymer. The polymer solution is heated to a preselected temperature below the flashpoint temperature of the polymer solution. The polymer solution is held in reservoir and propelled through a nozzle to create a continuous flow of polymer solution in the form of a stationary wave. The polymer solution flowing out of the nozzle returns to the reservoir, wherein it again will be sent through the nozzle. A substrate having a lower surface is moved over the stationary wave at a preselected rate such that the lower surface of the substrate contacts the stationary wave. A uniform film of polymer is coated on the lower surface of the substrate after the substrate has been moved over and passed the stationary wave.

Solvents from the polymer and any carrier may be removed by baking the substrate. Substrates of different shapes may be processed by the method of the present invention. For example, uniform thicknesses of polymer may be coated on both round and square substrates. In addition, other irregular shaped substrates may be coated with a uniform polymer film using the process of the present invention.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
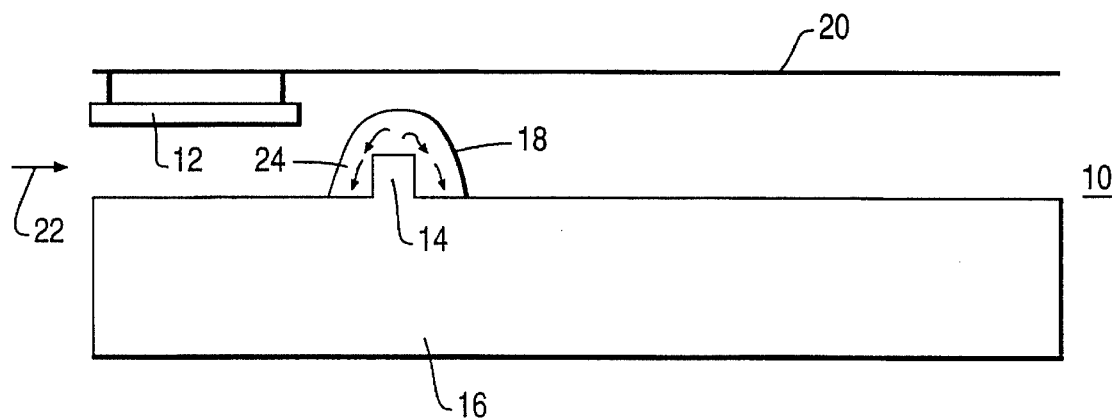
FIG. 1 is a sectional view of a substrate approaching a polymer reservoir and polymer wave.

With reference to the figures and in particular to FIG. 1, a sectional view of a wave solder machine 10 is depicted with a substrate 12 approaching it in accordance with a preferred embodiment of the present invention. Wave solder machine 10 includes a nozzle 14 that allows a polymer in liquid form in reservoir 16 to be pumped through it to form a stationary wave 18 having a predetermined flow rate. A polymer solution may be a polymer in liquid form or may contain other components other than a polymer, such as a solvent carrier, in accordance with a preferred embodiment of the present invention. Substrate 12 is moved along conveyor track system 20 in the direction of arrow 22.

Prior to being placed on conveyer track system 20, substrate 12 is cleaned with solvents. In the depicted example, substrate 12 would be cleaned with isopropyl alcohol and dried in clean air or nitrogen. More extensive cleaning including acid cleaning can be performed prior to placing substrate 12 on conveyer track system 20.

Figure 2:
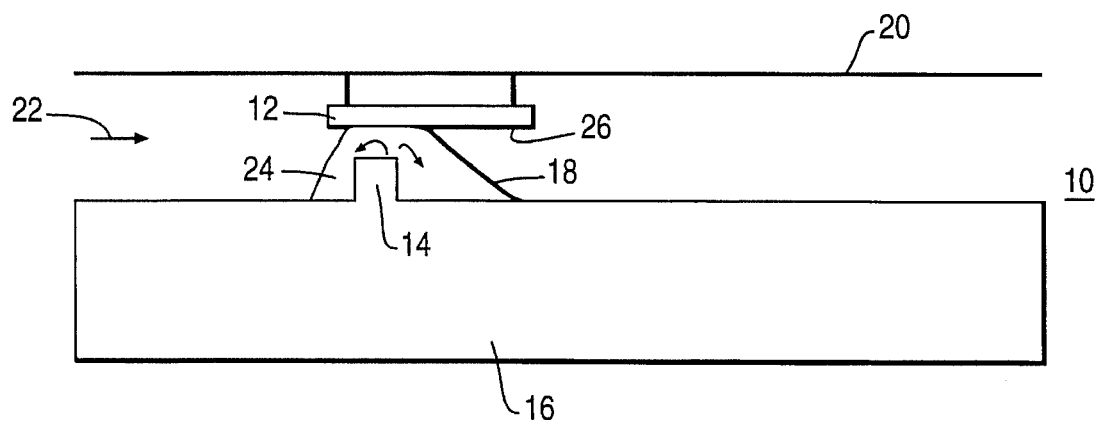
FIG. 2 depicts a sectional view of a polymer reservoir with a polymer wave in contact with the lower surface of the substrate.

In FIG. 2, the flow direction 24 of wave 18 is against lower surface 26 of substrate 12. The width of wave 18 is such that wave 18 will be contact with all of lower surface 26 of substrate 12 as substrate 12 is conveyed along the direction of arrow 22. In particular, substrate 12 is spaced above nozzle 14 in a predetermined relation to the height of wave 18 such that the polymer solution will flow against lower surface 26 of substrate 12. Substrate 12 will move through wave 18 and the polymer coating on lower surface 26 is air dried thereafter. This process coats a polymer film on surface 26 of substrate 12. The thickness of this polymer film or coating may be adjusted by adjusting the rate of movement of substrate 12 along conveyer track system 20. The thickness of the polymer coat also may be adjusted by the temperature of the polymer solution and the solvent content of the polymer or the amount of solvent in any carrier that might be used. Typically, a polymer is coated on substrate 12 from about 10,000 Å to about 5 mils. The heating of the polymer solution will depend on the type of polymer or carrier employed. For example, in polyimide materials the temperature is usually from about 25 degrees C. to about 150 degrees C. For polyimide materials in these ranges, a typical rate of speed is from about 0.1 inches per second to about 2.0 inches per second for the speed at which substrate 12 passes through wave 18.

After passing substrate 12 through wave 18, the substrate is later baked at an elevated temperature to remove all solvents that may be in the polymer coating on lower surface 26. The baking temperature may be from about 100 degrees C. to about 425 degrees C. The substrate is then cooled and then other processing of substrate 12 may be performed thereafter.

The thickness of the coating on lower surface 26 of substrate 12 may be controlled by the height of wave 18 or the depth of lower surface 26 into wave 18 and the velocity of the polymer solution through nozzle 14. The polymer solution feeding into nozzle 14 is temperature controlled, which allows for controlling the velocity of the polymer solution. In addition, the supply of polymer solution into nozzle 14 is controlled such that the velocity of the polymer solution through nozzle 14 and the height of wave 18 may be controlled.

The present invention may employ existing equipment used for wave soldering with a minimum modification. The heaters in the systems may require some modification for use with polymers so that the temperatures could adjusted within the ranges necessary to maintain temperatures below the flashpoints of the polymers. In addition, improved productivity occurs because substrates may be automatically handled in batches.

Presently available wave solder machines may be employed in accordance with a preferred embodiment of the present invention. Such machines would be modified or adjusted such that polymer such as polyimides may be heated and used within them. For example, Model 17700D from Heller Industries, Inc. and Atmos 100CR from Electrovert USA Corporation are examples of wave solder machines that may be employed in accordance with a preferred embodiment of the present invention.

Polymers such as polyimides are organic and contain certain solvents which could have low flash points. In addition, the polymer may be placed in a solvent carrier with the carrier having a flashpoint temperature. The term "flashpoint" is the temperature at which solvent will ignite. Typically, flashpoints for solvents are under 100 degrees C. and the polymer employed typically should be heated to about 10 degrees C. below the lower flashpoint of the solvent in the polymer or the solvent carrier.

Polymers material such as polyimides and epoxies may be employed in accordance with a preferred embodiment of the present invention. An example of a polymer that could be employed is Pyraline Polyimide products available from Du Pont Electronic Materials Division. Polyimides, PI2573 and PI2571, are Pyraline Polyimide products that are employed for spin coating on silicon wafers, but could be used to coat other types of substrates via the wave technique of the present invention. Coating thicknesses using these polyimides may be from about 10 µm to about 25 µm. Of course, other polymers may be employed in the process of the present invention for coating a number of different types of substrates from silicon wafers to substrates for multi-chip modules. The shapes of the substrates may vary from circular to square, or may be other irregular shapes.

According to the present invention, polymer material savings are gained because of low evaporation loss, precise temperature control, and minimum surface exposure to materials in comparison with other techniques, such as spin coating, dipping, and screening of substrates. Furthermore, the present invention provides improved uniformity for coatings on rectangular or irregular substrates.

While the invention has been particularly shown and described with reference to a preferred embodiment, it will be understood by those skilled in the art that various changes in form and detail may be made therein without departing from the spirit and scope of the invention.

What is claimed is:

1. A method for coating a wafer substrate with a polymer material, the method comprising:

heating a polymer solution to a temperature below a flashpoint of the polymer solution;

creating a stationary wave using a polymer solution; and moving a wafer substrate having a lower surface over the stationary wave, wherein the stationary wave contacts the lower surface of the wafer substrate and a uniform film of polymer is formed on the lower surface of the wafer substrate.

2. The method of claim 1, wherein the moving step includes moving the wafer substrate in a first direction at a rate of about 0.1 inches per second to about 2.0 inches per second over the stationary wave, wherein the stationary wave contacts the lower surface of the wafer substrate and a uniform film of polymer is formed on the lower surface of the wafer substrate.

3. The method of claim 1, wherein the step of heating includes heating a polyimide.

4. The method of claim 3, wherein the heating step includes heating the polyimide from about 25 degrees C. to about 150 degrees C.

5. The method of claim 1, wherein the polymer solution contains two components, a polymer and a solvent carrier, each component having a flashpoint, wherein the flashpoint of one component is lower than the flashpoint of the other component and wherein the step of heating includes heating the polymer solution to a temperature below the lower flashpoint of the two components.

6. The method of claim 5, wherein the polyimide is pyraline polyimide.

7. The method of claim 1, wherein the moving step includes moving a square wafer substrate over the stationary wave.

8. The method of claim 1, wherein the step of moving a substrate includes moving a round wafer substrate over the stationary wave.

9. The method of claim 5, wherein the uniform film of polymer is formed in a layer from about 10,000 angstroms to about 5 mils.

10. The method of claim 5, further comprising removing solvents from the polymer after moving the wafer substrate over the stationary wave.

11. The method of claim 10, wherein the removing step comprises baking the wafer substrate from about 100 degrees C. to about 125 degrees C.

12. A method for coating a wafer substrate with a polymer, the method comprising:

heating a polymer solution to a temperature below a flashpoint of the polymer solution;

pumping the polymer solution through a nozzle to form a stationary wave;

moving the wafer substrate in a direction causing a lower surface of the wafer substrate to contact the stationary wave, wherein a uniform film of polymer is formed on the lower surface of the wafer substrate.

13. The method of claim 12, further comprising adjusting a thickness of the uniform film of polymer by adjusting the temperature of the polymer solution in the heating step.

14. The method of claim 13, wherein the adjusting step further comprises adjusting the thickness the uniform film of polymer by adjusting a solvent content in the polymer solution.

* * * * *